United States Patent
Fang et al.

(10) Patent No.: US 9,916,338 B2
(45) Date of Patent: *Mar. 13, 2018

(54) MANAGING DATA RECORDS

(71) Applicant: International Business Machines Corporation, Armonk, NY (US)

(72) Inventors: Min Fang, Beijing (CN); Di Jin, Beijing (CN); Zhen Yu Shi, Beijing (CN); Nigel G. Slinger, Los Gatos, CA (US); Shu Wang, Beijing (CN); Li Fei Zheng, Beijing (CN); Wen Jie Zhu, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 268 days.

This patent is subject to a terminal disclaimer.

(21) Appl. No.: 14/695,771

(22) Filed: Apr. 24, 2015

(65) Prior Publication Data

US 2016/0314138 A1    Oct. 27, 2016

(51) Int. Cl.
*G06F 17/30*    (2006.01)
*H03M 7/30*    (2006.01)

(52) U.S. Cl.
CPC .. *G06F 17/30339* (2013.01); *G06F 17/30371* (2013.01); *G06F 17/30595* (2013.01); *G06F 17/30982* (2013.01); *H03M 7/60* (2013.01); *H03M 7/3084* (2013.01); *H03M 7/6058* (2013.01)

(58) Field of Classification Search
CPC ......... G06F 17/30339; G06F 17/30595; G06F 17/30982; G06F 17/30371; H03M 7/60; H03M 7/6058; H03M 7/3084

USPC ....... 707/693, 791, 795, 796, 802, 807, 809, 707/812, 821; 711/100, 161, 162
See application file for complete search history.

(56) References Cited

U.S. PATENT DOCUMENTS

| | | | |
|---|---|---|---|
| 5,537,658 A | * | 7/1996 | Bakke ................... G06F 3/0601 707/999.2 |
| 5,627,995 A | | 5/1997 | Miller et al. |
| 5,842,196 A | | 11/1998 | Agarwal et al. |

(Continued)

OTHER PUBLICATIONS

Douglis, F., "The Compression Cache: Using On-line Compression to Extend Physical Memory", Winter USENIX conference, Jan. 1993, 16 pages.

(Continued)

*Primary Examiner* — Greta Robinson
(74) *Attorney, Agent, or Firm* — Stosch Sabo

(57) ABSTRACT

Data records may be managed in a relational database by monitoring, a record length for a first data record in a page of memory, an amount of free space in the page, and a page length. In response to receiving an operator command to replace the first data record with a second data record, a database management system may determine whether an estimated record length of a compressed second data record is outside of the amount of free space in the page. In response to determining the estimated record length of a compressed second data record is outside of the amount of free space in the page, the database management system may determine whether an estimated length of a compressed page is outside of the page length. In response to determining the estimated length of a compressed page is within the page length, the page may be compressed.

20 Claims, 5 Drawing Sheets

(56) References Cited

U.S. PATENT DOCUMENTS

| | | | |
|---|---|---|---|
| 6,950,834 B2 | 9/2005 | Huras et al. | |
| 7,299,243 B2 | 11/2007 | Maxfield | |
| 7,555,491 B2 | 6/2009 | Cole et al. | |
| 7,783,855 B2 * | 8/2010 | Goswami | G06F 17/30336 707/693 |
| 8,656,075 B2 | 2/2014 | Amit et al. | |
| 8,706,727 B2 | 4/2014 | Yang et al. | |
| 8,954,693 B2 | 2/2015 | Sea et al. | |
| 9,043,294 B2 | 5/2015 | Nelke et al. | |
| 9,503,100 B1 * | 11/2016 | Das | H03L 7/02 |
| 9,564,919 B2 * | 2/2017 | Fang | G06F 17/30371 |
| 9,690,799 B2 | 6/2017 | Schreter et al. | |
| 2010/0262588 A1 | 10/2010 | Sun | |
| 2011/0246703 A1 | 10/2011 | Franceschini et al. | |
| 2012/0246132 A1 | 9/2012 | Sebastian et al. | |
| 2014/0074805 A1 | 3/2014 | Kapoor et al. | |
| 2015/0370488 A1 | 12/2015 | Watanabe et al. | |
| 2016/0110408 A1 | 4/2016 | Madhavarapu et al. | |
| 2017/0068696 A1 * | 3/2017 | Fang | G06F 17/30371 |
| 2017/0068697 A1 * | 3/2017 | Fang | G06F 17/30371 |

OTHER PUBLICATIONS

Franaszek, P., et al., "Algorithms and data structures for compressed-memory machines", IBM J. Res. & Dev. vol. 45 No. 2, Mar. 2001. 24 pages.

Roy, S., et al., "Improving System Performance with Compressed Memory", Hewlett Packard, IEEE 15th International Parallel and Distributed Processing Symposium, Apr. 23-27, 2001. San Francisco, CA. 16 pages.

Fanghaenel et al., "Best Practices Storage Optimization with Deep Compression", IBM Corporation, pp. 1-35, Apr. 2012, © Copyright IBM Corporation 2008, 2012.

IBM, "Reserving free space for table spaces", DB2 for z/OS 11: Managing DB2 performance, IBM Knowledge Center. http://www-01.ibm.com/support/knowledgecenter/SSEPEK_11.0.0/com.ibm.db2z11.doc.perf/src/tpc/db2z_reservefreespacetable.dita.

Fang et al., "Managing Data Records", U.S. Appl. No. 15/139,477, Filed Apr. 27, 2016.

Accelerated Examination Support Document, U.S. Appl. No. 15/139,477, dated Apr. 13, 2016. 14 pgs.

List of IBM Patents or Patent Applications Treated as Related, dated Apr. 18, 2016. 2 pgs.

Fang et al., "Managing Data Records", U.S. Appl. No. 15/363,332, filed Nov. 29, 2016.

Fang et al., "Managing Data Records", U.S. Appl. No. 15/363,373, filed Nov. 29, 2016.

Accelerated Examination Support Document, U.S. Appl. No. 15/363,332 dated Nov. 10, 2016. 12 pgs.

Accelerated Examination Support Document, U.S. Appl. No. 15/363,373 dated Nov. 10, 2016. 13 pgs.

List of IBM Patents or Patent Applications Treated as Related, dated Nov. 28, 2016. 2 pgs.

Tremaine, et al., "IBM Memory Expansion Technology (MXT)", IBM Journal of Research and Development, vol. 45, No. 2, Mar. 2001. 16 pages.

* cited by examiner

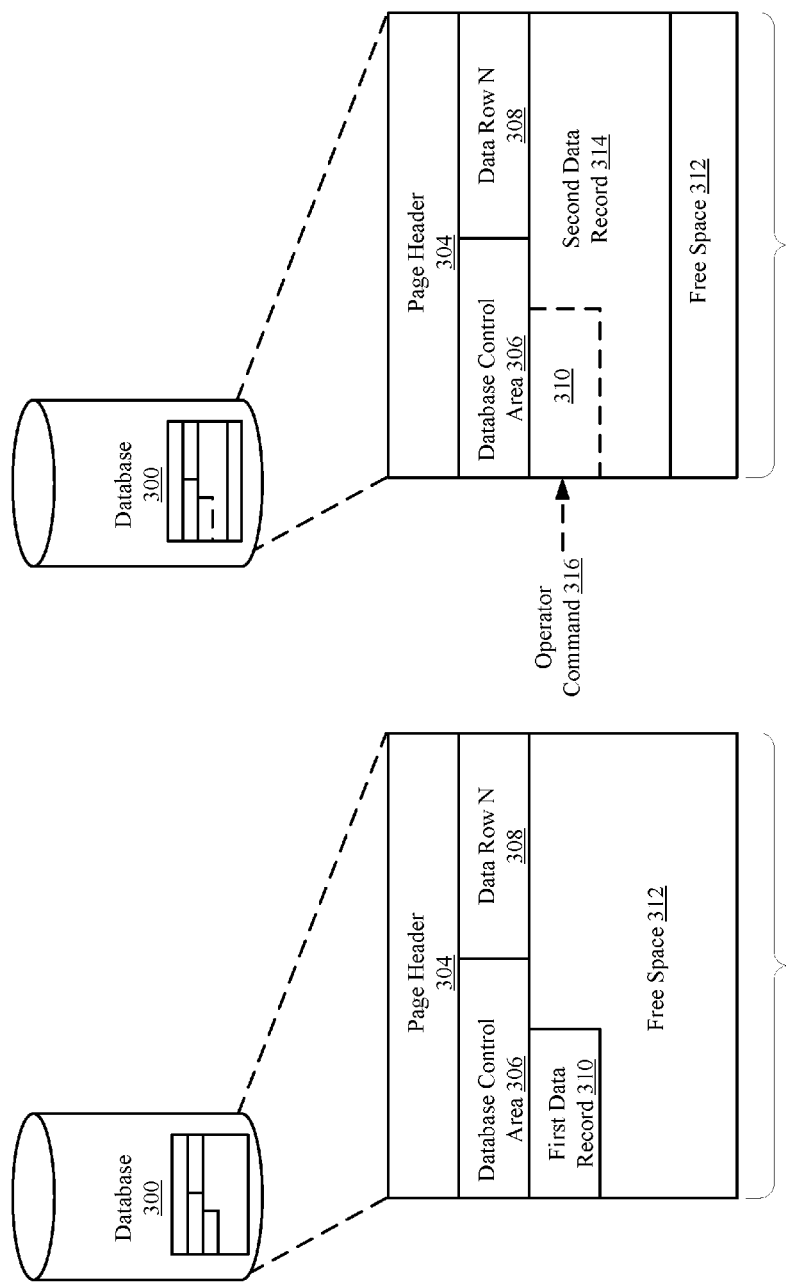

MANAGING DATA RECORDS

BACKGROUND

The present disclosure relates generally to data processing, and more particularly, to managing data records in a database. The amount of data that needs to be managed by enterprises is growing at an increasing rate. As the amount of data continues to increase, the need to efficiently manage databases containing data records may also increase.

SUMMARY

Aspects of the disclosure may include a computer implemented method, system, and computer program product for managing data records in a relational database. The computer implemented method, system, and computer program product may include monitoring in the relational database a record length for a first data record in a page, an amount of free space in the page, and a page length of the page. The relational database may receive an operator command to replace the first data record with a second data record. Based upon receiving the operator command, the computer implemented method, system, and computer program product may determine whether a record length of a compressed second data record is outside of the amount of free space in the page. In response to determining that the record length of the compressed second data record is outside of the amount of free space in the page, the computer implemented method, system, and computer program product may determine whether a length of a compressed page which includes the second data record is outside of the page length. In response to determining that the length of the compressed page is within the page length, the computer implemented method, system, and computer program product may compress the page including the second data record in the relational database.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 3A depicts one embodiment of a page in a relational database before receiving an operator command.

FIG. 3B depicts one embodiment of a page in a relational database after receiving an operator command to replace a first data record with a second data record.

Figure 1:
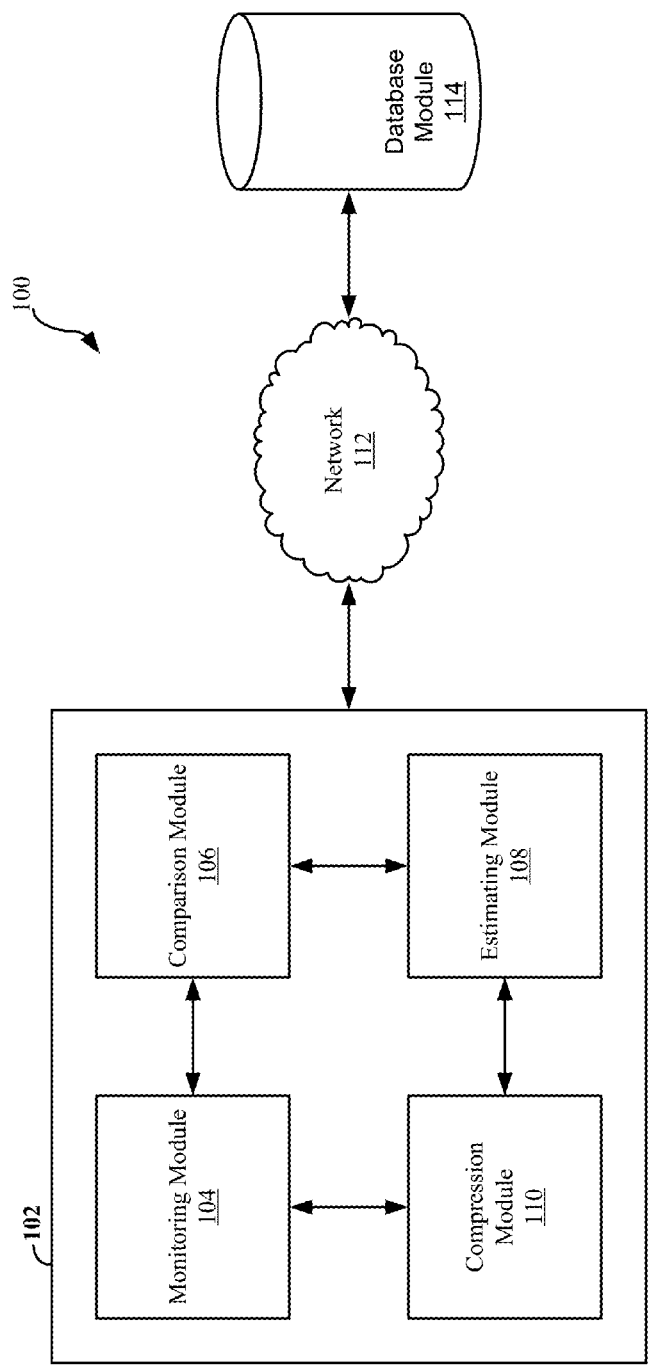
FIG. 1 depicts a high level block diagram of one embodiment of an example system for managing data records in a relational database.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure include a computer-implemented method, system, and computer program product for managing data records in a relational database. The computer-implemented method may include monitoring, in a relational database, a record length for a first data record in a page, an amount of free space in the page, and a page length. In embodiments, the computer-implemented method may receive an operator command to replace the first data record with a second data record. In response to receiving the operator command, the computer-implemented method may determine whether a record length of a compressed second data record is outside of the amount of free space in the page. If the record length of the compressed second data record is outside of the amount of free space in the page, the computer-implemented method may determine whether a compressed page length is outside of the page length. In embodiments, the compressed page length may include the second data record. In response to determining that the compressed page length is within the page length, the computer-implemented method may compress the page in the relational database. While the present disclosure is not necessarily limited to such applications, various aspects of the disclosure may be appreciated through a discussion of various examples using this context.

Various embodiments of the present disclosure are directed towards reducing performance degradation in a database. A database may include data and metadata that may be stored on a persistent memory mechanism, such as, but not limited to, a set of hard disks. The data and metadata may be stored in a database in a logical manner. For example, the data and metadata may be stored according to relational and/or object-relational database constructs. Database metadata may define database objects, such as tables, object tables, views, or complex types, such as object types and table functions. Structured Query Language (SQL) data definition language ("DDL") instructions are issued to a database server to create or configure database objects.

Generally, data may be logically arranged within a database as one or more data containers. A container may comprise records, and the data within each record may be organized into one or more fields. In relational database systems, the data containers are generally referred to as tables, the records are referred to as rows, and the fields are referred to as columns. Other database architectures may use other terminology. For the purpose of explanation, the examples and terminology used herein shall be commonly associated with relational databases. Therefore, the terms "table", "row", and "column" shall be used herein to refer respectively to the data container, record, and field.

A relational database may present information through a series of one or more tables. Each table may include a series of rows and columns. A table may be referred to as a relation in that a table is a collection of objects of the same type (e.g., rows of customer information). Data records may be stored in a table according to common keys or concepts. A table may consist of one or more pages. A page may be a fixed-length contiguous block of virtual memory. In embodiments, the term page may be used interchangeably with the term block. Pages may have a predefined fixed length, such as, but not limited to, 4K (kilobytes), 8 k, 16 k, or 32K. Similarly, a data record may have a fixed length or a variable length.

Typically, each new data record to be stored in a relational database may be inserted into the first available free space starting at the beginning of a page. However, when a relational database receives an UPDATE SQL command, an updated data record meant to replace an original data record may no longer fit onto the page of the table. Typically, an UPDATE SQL command may modify multiple rows within a table. When an updated data record is received and no longer fits into the page as a result of an UPDATE SQL command, an overflow record may be created by inserting the updated data record into another page. An overflow record may be a row of data that may be small enough to fit on a single page of memory but may instead be stored across two or more pages. When an overflow record is created, a pointer may be left in the original page to mark where the updated record should be. By inserting a pointer in the original page, the index entry in the index page may still point to the position of the original data record, creating a need for additional input/output (I/O) operations if a simple request to retrieve that data record is received.

In the context of the UPDATE SQL command, percentage free space (PCTFREE) may be used to manage the issues associated with creating an overflow record. PCTFREE may be a block storage parameter used to specify how much space should be left in a database block for future updates. However, if PCTFREE is set too large, disk space may be wasted. Additionally, if PCTFREE is set too large, the buffer pool hit ratio (e.g., a measure of how often a page access is satisfied without requiring an I/O operation) may decrease because, as a result of receiving a SELECT SQL command, more pages may need to be accessed due to fewer records per page being transferred. Conversely, if PCTFREE is too small or not set at all, many overflow records may be created in response to the relational database receiving UPDATE SQL commands.

If the PCTFREE is set incorrectly and needs to be modified, a database management system may perform a reorganization operation, either online or offline, to reclaim wasted space, improve database uptime or improve data access speeds. Performing an online reorganization may cause significant I/O operations and performing an offline reorganization may be an unacceptable alternative. For databases with a large number of tables, a database administrator may not have time to manually determine the right PCTFREE setting, resulting in a potentially incorrect PCTFREE setting or no PCTFREE setting at all.

Aspects of the present disclosure may include a database management system (DBMS) monitoring a record length for a first data record (Herein used interchangeably with the term "first variable data record") in a page, an amount of free space in the page, and a page length in a relational database. The following embodiments may be described in terms of a DB2® database environment and SQL commands (DB2 is a registered trademark of International Business Machines Corporation of Armonk, N.Y.) but are done only for illustrative purposes and are not to be considered limiting. For example, the computer-implemented method may be equally applicable to other relational databases such as Oracle, SyBase®, Microsoft's SQL Server®, Microsoft Access® and MySQL®. (SyBase is a registered trademarks of Sybase, Inc. of Concord, Mass. SQL Server and Microsoft Access are a registered trademarks of Microsoft Corporation of Redmond, Wash. MySQL is a registered trademark of MySQL AB, a company of Knivsta, Sweden.)

In embodiments, the amount of free space in the page may include reserved or unused space in the page in the relational database. In various embodiments, the term 'space' may be used interchangeably with the term 'memory.' The DBMS may receive an operator command to replace the first data record with a second data record (Herein used interchangeably with the term "second variable data record"). In embodiments, an operator command may define the different structures within a database and may be bound to functions which define operator command behavior in specified contexts. In certain embodiments, an operator command may correspond with modifier commands (e.g., insert, delete, and update commands). Receiving the operator command may further include comparing the record length of the second data record with the amount of free space in the page. Based upon comparing the record length of the second data record with the amount of free space in the page, DBMS may determine the record length of the second data record to be within the amount of free space in the page. In response to determining the record length of the second data record to be within the amount of free space in the page, the DBMS may replace the first data record with the second data record, and may continuing monitoring the database.

If it is determined that the record length of the second data record is outside of the amount of free space in the page, the DBMS may determine whether a record length of a compressed second data record is outside of or exceeds the amount of free space in the page. Determining whether a record length of a compressed second data record is outside of the amount of free space in the page may further include estimating a record length of a compressed second data record. In response to estimating the record length of a compressed second data record, the DBMS may compare the estimated record length of a compressed second data record with the amount of free space in the page.

In embodiments, the DBMS may determine, based upon comparing the estimated record length of a compressed second data record with the amount of free space in the page, the record length of the compressed second data record is within or smaller than the amount of free space in the page. Consequently, the DBMS may compress the second data record and may replace the first data record with the compressed second data record in the page in the relational database.

In various embodiments, the DBMS may determine, in response to determining the record length of the compressed second data record is outside of the amount of free space in the page, whether a compressed page length is outside of the page length. In embodiments, a compressed page length may include all of the data records stored within a page. In certain embodiments, a compressed page length may include all of the data records and metadata stored within a page. In further embodiments, the compressed page includes the second data record. Determining whether a compressed page length is outside of the page length may include estimating a length of a compressed page and comparing, in response to estimating, the length of the compressed page with the page length.

Comparing the length of the compressed page with the page length may include determining the length of the compressed page is within the page length. In response to determining that the length of the compressed page is within the page length, the DBMS method may compress the page. When the page has been compressed, the compressed page may replace the uncompressed page. Conversely, the DBMS may determine that the length of the compressed page is outside of the page length. In response to determining that the length of the compressed page is outside of the page length, an overflow record may be created for the second data record.

FIG. 1 depicts a high level block diagram of a DBMS for managing data records in a relational database, according to embodiments. In the example embodiment shown in FIG. 1, the DBMS 100 comprises a computer system/server 102, the computer system/server 102 including a monitoring module 104, a comparison module 106, an estimation module 108, and a compression module 110. The DBMS 100 additionally includes a database module 114 in communication with the computer system/server 102 through a network 112. In various embodiments, the database module 114 may be a relational database, described herein.

The computer system/server 102 may be operational with numerous other general purpose or special purpose computing system environments or configurations. Examples of well-known computing systems, environments, and/or configurations that may be suitable for use with computer system/server 102 may include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system/server 102 may be described in the general context of computer system-executable instructions, such as program modules, being executed by a computer system. Generally, program modules may include routines, programs, objects, components, logic, data structures, and so on that perform particular tasks or implement particular abstract data types. The computer system/server 102 may be practiced in distributed cloud computing environments where tasks are performed by remote processing devices that are linked through a communications network. In a distributed cloud computing environment, program modules may be located in both local and remote computer system storage media including memory storage devices (e.g., databases).

The computer system/server 102 may communicate with the database module 114 through the network 112. The network 112 may include one or more networks such as a local area network (LAN), a general wide area network (WAN), and/or a public network (e.g., the Internet). The network 112 may be a hub which other modules within the DBMS 100 may establish a communication connection. In embodiments, the database module 114 may be an online database and/or an offline database. In embodiments, an offline database may be a local database stored on a computer (e.g., a server). Conversely, an online database may be stored in a shared pool of network configurable resources or it may be stored in an online server (e.g., a server on the Internet).

The monitor module 104 may communicate through the network 112 to scan the database module 114. In various embodiments, the monitor module 104 may scan the database module 114 continuously. The monitor module 104 may include database software. Database software may include application software and/or system software, where system software may include operating systems, device drivers, or utilities (e.g., computer programs designed to assist users in maintenance). In certain embodiments, the database software used by the monitor module 104 may be interfaced with the database module 114 such that the monitor module 104 may manage and track the data stored in the database module 114. For example, the monitor module 104 may oversee the insertion, deletion, or modification of data within the database module 114. In embodiments, the monitor module 104 may monitor the record lengths of data records in the database module 114, the amount of free space in the pages in the database 114, and the page lengths in the database module 114. For example, the monitor module 104 may access the database index of the database module 114 to identify a record soon to be changed in response to receiving an UPDATE SQL command. In various embodiments, the monitor module 104 may retrieve the data from the database module 114 for processing within the computer system/server 102. The monitor module 104 may be in constant communication with the comparison module 106, the estimation module 108 and the compression module 110.

The comparison module 106 may utilize information collected from the monitoring module 104 to determine whether or not additional action is required by the computer system/server 102. In embodiments, additional actions that may be required may include estimating lengths for compressed data records and/or compressed pages, comparing estimated compressed record lengths with the amount of free space left in a page, and comparing estimated compressed page lengths with the page lengths. For example, the monitoring module 104 may, in response to tracking an UPDATE SQL command for a data record, access the database index of the database module 114. Accessing the database index of the database module 114 may include retrieving statistics associated with the data record and the updated data record, such as the record length, the amount of free space remaining in the page where the data record is stored, and the page length where the data record is stored. The statistics associated with the data records may be sent to the comparison module 106 for processing.

For example, in processing, the comparison module 106 may compare the record length of the updated data record with the amount of free space remaining in the page in the table. Continuing the example, if the record length of the updated data record (e.g., second data record) does not go outside the amount of free space in the page, the UPDATE SQL command is carried out and the original data record (e.g., first data record) is replaced by the updated data record. Conversely, if the record length of the updated data record does go outside the amount of free space in the page, the comparison module 106 may communicate this information, including the record length of the update data record and the amount of free space in the page, to the estimating module 108.

The comparison module 106 may be in constant communication with the estimating module 108. The estimating module 108 may invoke a stand-alone utility (e.g., DSN1COMP in DB2® z/OS) within the database module 114 to estimate space savings that may be achieved by compressing data in a page in a table. In embodiments, the estimating module 108 may estimate space savings that may be achieved by compressing a page in a table. In various embodiments, estimating space savings may include multiplying the record length of a data record by a compression ratio. In certain embodiments, the compression ratio may be a ratio of the size of the encoded output data to the size of the original data. In further embodiments, the size of the encoded output data may be measured during storage or during transmission. Various methodologies for estimating record lengths of compression ratios are envisioned and the examples described herein are for illustrative purposes only.

Continuing the example where the record length of the updated data record goes outside the amount of free space in the page, the estimating module 108 may estimate the record length of a compressed updated data record. Once estimated, the estimating module 108 may send the estimated record length of a compressed updated data record to the comparison module 106 for processing. The comparison module 106 may compare the record length of the estimated compressed updated data record with the amount of free space in the page. If the record length of the estimated compressed updated data record does not go outside of the amount of free space in the page, the update data record is sent to the compression module 110 for processing.

Conversely, if the record length of the estimated compressed updated data record does go outside of the amount of free space in the page, the estimating module 108 may estimate the page length of a compressed page. In embodiments, compressing a page may include compressing data records within a page, including the updated data record (e.g., second data record). In further embodiments, compressing a page may include compressing all data within a page, including data records as well as metadata. The estimated compressed page length may be sent to the comparison module 106 to compare the compressed page length with the page length of the target page. If the compressed page length does not go outside of the page length, the page, including the updated data record, is sent to the compression module 110 for processing. Conversely, if the compressed page length does go outside of the page length, the computer system/server 102 may notify the database module 114 to take additional action, such as, for example, create an overflow record for the updated data record or to perform a database reorganization.

The compression module 110 may be in constant communication with the monitoring module 104, the comparison module 106, and the estimating module 108. The compression module 110 may receive data records or pages from the monitoring module 104 in response to determinations calculated at the comparison module 106. In embodiments, the compression module 110 may access the database module 114 through the network 112 to retrieve data records or pages in response to determinations calculated at the comparison module 106. The compression module 110 may implement a plurality of compression techniques to compress data records or pages in response to determinations at other modules within the computer system/server 102. In embodiments, the compression module 110 may utilize hardware and/or software compression techniques to compress the data records or pages, as discussed in more detail below. In certain embodiments, the compression module 110 may compress data records while the database module 114 is either online or offline.

In various embodiments, the software compression techniques may include dictionary-based compression, where phrases within data records are replaced with pointers. Replacing the phrases with pointers may include building an internal data table (e.g., a dictionary) by encoding the data stored in the database. In embodiments, the dictionary-based compression may be adaptive or non-adaptive. For example, in using an adaptive dictionary-based compression technique for a non-compressed table, when a database receives SQL commands such as INSERT, REORG, LOAD, UNLOAD, a background processor may begin to collect the data required to be able to encode the data to build up the internal data table instead of having a predetermined internal data table with a non-adaptive dictionary-based compression technique. It is to be understood that other software compression techniques known to one of skill in the art can be implemented in other embodiments.

In various embodiments, hardware compression techniques may be preferred over software compression techniques. In embodiments where the hardware compression techniques are utilized, the hardware compression techniques may utilize system provided hardware compression services (e.g., a tape library) to perform compression on data records or pages. In further embodiments, the compression techniques may include row compression, page compression, or column compression, depending upon the type of database. If a data record or page has been compressed at the compression module 110, the compressed data may be transferred to the database module 114 to finish the SQL operator command which initiated the modules within the computer system/server 102. In embodiments, the computer system/server 102 and the database module 114 may be located within the same computer system, such as the example described in FIG. 2. It is to be understood that other hardware compression techniques known to one of skill in the art can be implemented in other embodiments.

Figure 2:
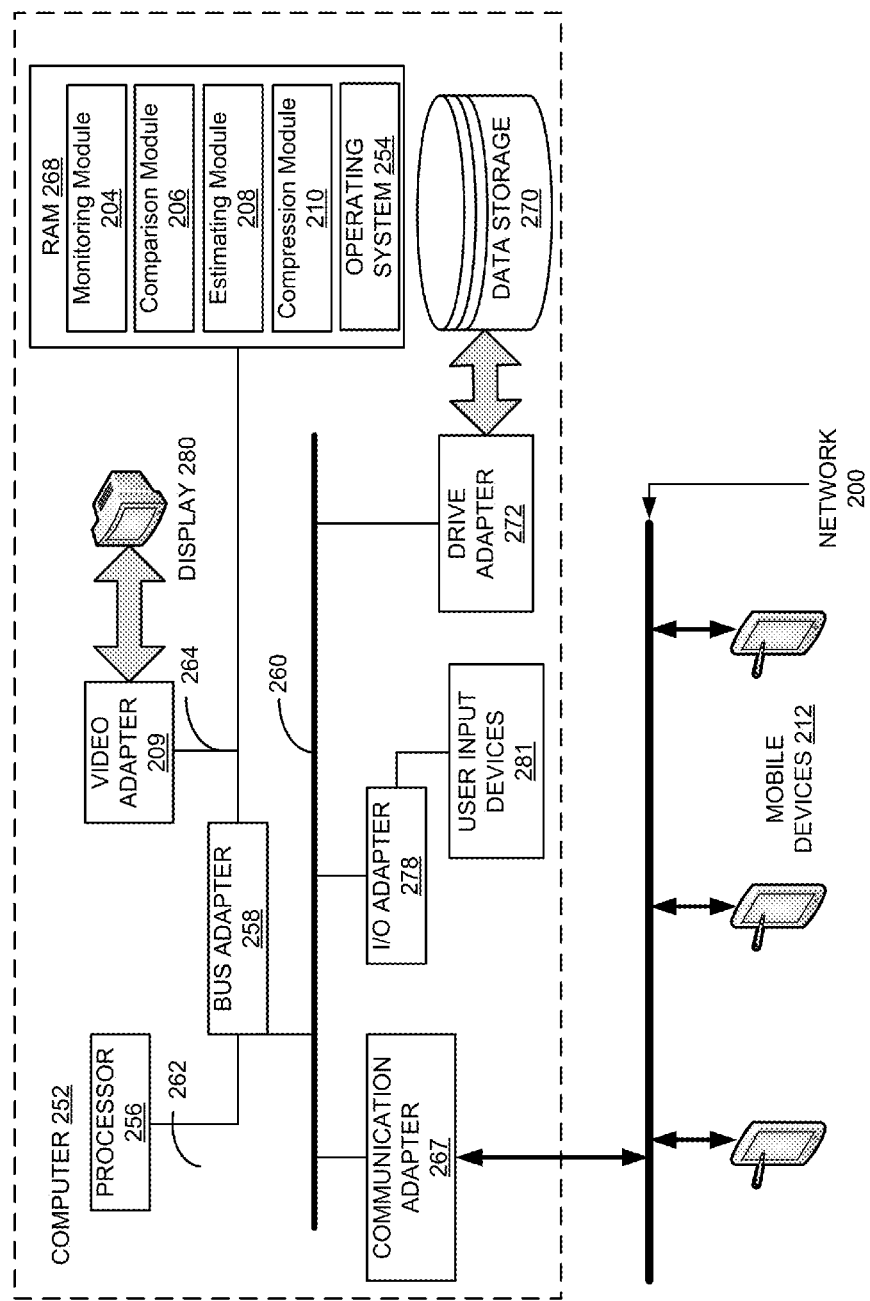
FIG. 2 depicts a block diagram of one embodiment of an example automated computing machinery.

FIG. 2 illustrates a block diagram of automated computing machinery, according to various embodiments. In the embodiment shown in FIG. 2, the computing machinery includes example computer 252 useful in performing aspects of the disclosure, according to various embodiments. The computer 252 of FIG. 2 includes at least one computer processor unit 256 or 'CPU' as well as random access memory 268 ('RAM') which is connected through bus adapter 258 to processor 256 and to other components of the computer 252.

The RAM 268 may include a monitoring module 204, a comparison module 206, an estimating module 208 and a compression module 210. Aspects of the present disclosure may be similar or the same as aspects described in FIG. 1 with respect to the monitoring module 104, the comparison module 106, the estimating module 108 and the compression module 110. The monitoring module 204, the comparison module 206, the estimating module 208 and the compression module 210 may be programs stored within the RAM 268 executable by the processor 256. In various embodiments, the modules 204-210 may be loaded from the data storage 270 and executed within the data storage 270. In certain embodiments, the modules 204-210 may be stored in one or more computing machineries and may be retrieved through a network, such as network 200, to be executed by the processor 256.

The RAM 268 may include an operating system 254. Operating systems useful for record filtering according to embodiments discussed herein include, but are not limited to, UNIX® (UNIX is a registered trademark of The Open Group in the United States and other countries), Linux® (Linux is a registered trademark of Linus Torvalds in the United States, other countries, or both), Microsoft XP™ (Microsoft and Windows are trademarks of Microsoft Corporation in the United States, other countries, or both), AIX®, IBM's i5/OS™, and others. The operating system 254 is shown in RAM (268), but many components of such software typically are stored in non-volatile memory also, such as, for example, on a data storage 270.

The computer 252 may also include disk drive adapter 272 coupled through expansion bus 260 and bus adapter 258 to processor 256 and other components of the computer 252. Disk drive adapter 272 connects non-volatile data storage to the computer 252 in the form of data storage 270. Disk drive adapters useful in computers include, but are not limited to, Integrated Drive Electronics ('IDE') adapters, Small Computer System Interface ('SCSI') adapters, and others. Non-volatile computer memory also may be implemented as an optical disk drive, electrically erasable programmable read-only memory (so-called 'EEPROM' or 'Flash' memory), RAM drives, and so on.

The data storage 270 may include one or more storage devices in a tiered or non-tiered configuration. The data storage 270 may be a database, such as the database module 116 described in FIG. 1 or a relational database described herein. The data storage 270 may communicate with one or more of the monitoring module 204, the comparison module 206, the estimating module 208, and the compression module 210.

The example computer 252 includes one or more input/output ('I/O') adapters 278. I/O adapters implement user-oriented input/output through, for example, software drivers and computer hardware for controlling output to display devices such as computer display screens, as well as user input from user input devices 281 such as, but not limited to, keyboards and mice. The example computer 252 includes a video adapter 209, which is an example of an I/O adapter specially designed for graphic output to a display device 280 such as, but not limited to, a display screen or computer monitor. In this example, video adapter 209 is connected to processor 256 through a high speed video bus 264, bus adapter 258, and the front side bus 262, which is also a high speed bus in this example.

The example computer 252 includes a communications adapter 267 for data communications with other computers 212, e.g., mobile devices, and for data communications with a data communications network 200. Such data communications may be carried out serially through RS-232 connections, through external buses such as a Universal Serial Bus ('USB'), through data communications networks such as IP data communications networks, and/or in other ways that are known to those of skill in the art. Communications adapters implement the hardware level of data communications through which one computer sends data communications to another computer, directly or through a data communications network. Examples of communications adapters include, but are not limited to, modems for wired dial-up communications, Ethernet (IEEE 802.3) adapters for wired data communications network communications, and IEEE 802.77 adapters for wireless data communications network communications.

FIG. 3A depicts one example of a page in a relational database 300 before receiving an operator command, according to embodiments. The database 300 may include a plurality of tables, where each table includes one or more pages. The data page 302 may represent how a data record may be stored within a page. Data within a page may be subdivided into one or more contiguous segments herein described as rows. When new data is added to the database 300, each data row in the page corresponds with data from at least a portion of a table. However, there may not always be a one-to-one correspondence between table rows and page rows. Although "rows" in a table and "rows" in a page are both known as "rows," they may be considered two distinct concepts. Accordingly, where necessary, this application may use the terms "table rows" and "page rows" to refer to "rows" of a table and "rows" of a page, respectively.

The data page 302 may include a page header 304. The page header 304 may include information describing the data page 302 and/or the tables corresponding with raw data stored within page 302. For example, the page header 304 may include metadata such as a table directory that describes various qualities of the tables and table rows for which the data page 302 comprises data. In an additional example, the page header 304 may include metadata such as a row directory indicating the starting address of and/or identifier for each data page row in the data page. The metadata in the page header 304 may, depending on the type of database, define and delimit the data page rows for the data page 302. Accordingly, in some databases, a data page row may be characterized as the lowest level subdivision of a data page whose address is discernable from the data page header, or as any subdivision of the data page for which the data page header lists an identifier for the index page within the database.

The data page 302 may include a database control area 306. The database control area 306 may be a reserve space within the data page 302. The reserve space within the data page 302 may include control information, such as the amount of PCTFREE remaining in the data page 302, the number of identifications within the data page 302, or the amount of holes (e.g., reusable space where a data record once was but is no longer stored) in the data page 302. In certain embodiments, the database control area 306 may be a page row header. The database control area 306 may delimit each data row. For example, the database control area 306 may include a variety of metadata, including but not limited to an identifier for the data page row, the number of columns that the database 300 should expect to read from the data page row, and/or the sizes of each column in the data page row (e.g., to provide the database 300 with the boundaries of each field in the data page row).

The data row N 308, where "N" is a row identifier, may be characterized by the database control area 306 and/or the page header 304. Similarly, the first data record 310 may be characterized by the database control area 306 and/or the page header 304. The first data record 310 may be an illustrative example of a data record with a variable length. The free space 312 may be an illustrative example of space allocated within a page to be used for storing data records. In various embodiments, the free space 312 may be an illustrative example of PCTFREE. The length of the page 302 may include data row N 308, the first data record 310, and the free space 312.

FIG. 3B depicts one example of the page in the illustrative relational database 300 after receiving an example operator command to replace a first data record with a second data record, according to embodiments described herein. FIG. 3B is an illustrative example depicting an embodiment in which the data page 302 from FIG. 3A receives an operator command 316 to replace the first data record 310 with a second data record 314. Aspects of FIG. 3B disclosure may be similar or the same as aspects described in FIG. 3A with respect to the database 300, the data page 302, the page header 304, the database control area 306, the data row N 308 and the free space 312.

The database 300 may receive an operator command 316 which affects the first data record 310 stored in the data page 302. The operator command 316 may correspond with modifier commands (e.g., insert, delete, and update operator commands), as discussed above. For the purposes of illustration, the discussion of FIG. 3A and FIG. 3B may make the assumption that the operator command 316 is an UPDATE SQL command and the second data record 314 is an updated data record of the first data record 310. When the database 300 receives the operator command 316, it may measure the length of the second data record 314 as well as the amount of free space 312 remaining in the page 302.

Block 310 is an illustrative example depicting the length of the first data record 310 in comparison to the second data record 314. The second data record 314 (e.g., updated first data record) may include data stored within the first data record 310. The second data record 314, as illustrated, may fit within the page 302 because the amount of free space 312 within the page 302 exceeded the record length of the second data record 314. In embodiments, the record length of the second data record 314 may go outside of the amount of free space 312 remaining within the page 302. In response to determining that the record length of the second data record 314 goes outside of the amount of free space 312 remaining within the page 302, the database 300 may determine whether or not to compress the second data record, whether or not to compress the page 302, or whether or not to create an overflow record for the second data record 314.

Figure 4A:
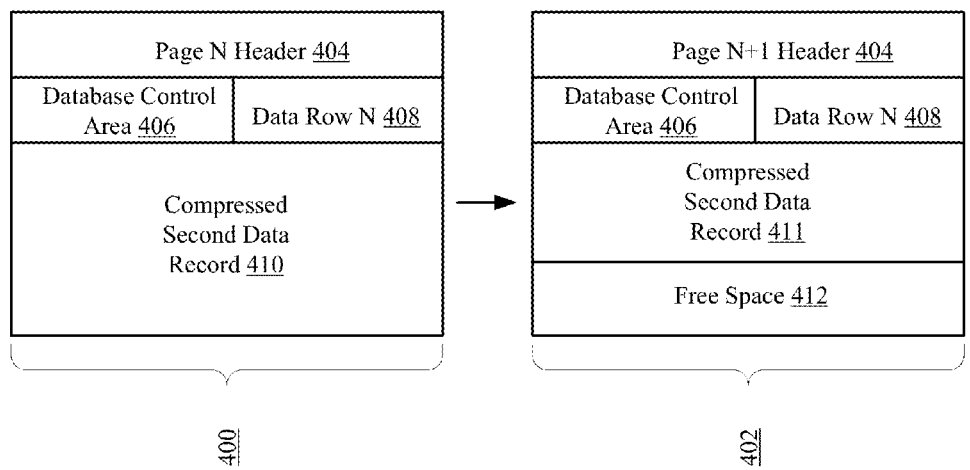
FIG. 4A depicts one embodiment of a page in a relational database with a compressed second data record being outside of the amount of free space in the same data page.

FIG. 4A depicts one example of a page in a relational database with a compressed second data record being outside of the amount of free space in the same data page, according to embodiments. The data page 400 may include a page N header 404, a database control area 406, a data row N 408, and a compressed second data record 410. Aspects of the present disclosure may be similar or the same as FIG. 3A and FIG. 3B with respect to the data page 302, the page header 304, the database control area 306, the data row N 308 and the free space 312.

In this example, the data page 400 contains a compressed second data record 410. In embodiments, the relational database containing the data page 400 may have received an operator command to update a first data record with a second data record. In response to receiving the operator command, the relational database, in this example, determined that the second data record goes outside of or exceeds the amount of free space in the data page 400. Subsequently, in response to determining that the second data record goes outside of the amount of free space in the data page 400, the database compressed the second data record in this example. However, as illustrated in this example, the compressed second data record 410 still goes outside of the amount of free space in the data page 400, creating an additional page 402 to store the remaining compressed second data record 411. In embodiments, the compressed second data record 410 and the compressed second data record 411 are portions of the same data record. In various embodiments, the compressed second data record 411 may be the remaining data from the compressed second data record 410 which went outside of the amount of free space within the data page 400.

The data page 402 illustrates how a compressed second data record 410 may overflow from the data page 400 to the data page 402. The data page 402 may include similar attributes to the data page 400, such as a page N+1 header 404, a database control area 406, a data row N 408. However, as shown, the data page 402 contains an amount of free space 412 because the compressed second data record 411 does not exceed the amount of free space in the data page 402. The depictions in FIG. 4A may be an illustration as to how an overflow record may be created within a database, where the data page 400 utilizes the data page 402 to store additional data that could no longer be stored within the data page 400.

Storage of compression units (e.g., compressed data records) in a data page may maintain compatibility with existing data pages in databases. In embodiments, this may allow the use of compressed data in preexisting databases without modification to the underlying format to the database. In various embodiments, the compressed data records and the compressed data pages may co-exist with uncompressed data records and uncompressed pages. For example, the data page 400 may contain data which is compressed (e.g., compressed second data record 410) and may contain data which is not compressed (e.g., data row N 408).

In certain embodiments, when the database receives a request that may require the database server to access one or more compressed data rows which have been stored in one or more data pages, the database server may locate where the compressed data rows have been stored. In response to locating where the compressed data rows may have been stored, the database server may decompress the compressed data rows (e.g., by performing a reorganization operation) and place the resulting decompressed matrix in a temporary buffer. Subsequently, the database server may then locate the desired data records from the compressed data rows in the decompressed matrix.

Figure 4B:
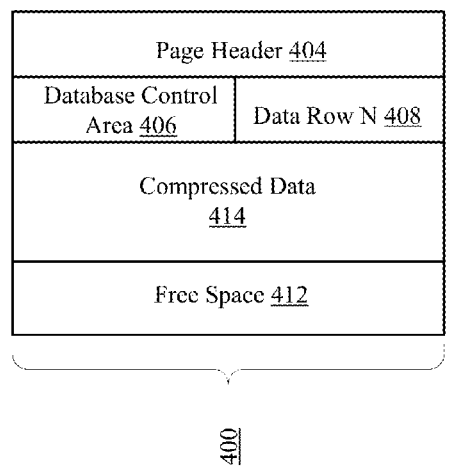
FIG. 4B depicts one embodiment of a compressed page in a relational database.

FIG. 4B depicts a compressed page in a relational database, according to embodiments. The data page 400 in FIG. 4B may be created in response to the relational database determining that a compressed second data record is outside of the amount of free space in the page (e.g., FIG. 4A) and in response to determining that the compressed page length for the data page 400 may be within the page length for the data page 400. The data page 400 may include the same components as the data page 400 from FIG. 4A, such as the page N header 404, the database control area 406, and the data row N 408. However, the data page 400 includes a compressed data 414 and an amount of free space 412. In embodiments, the compressed data 414 may be all of the data and/or metadata stored within the data page 400 from FIG. 4A, including the compressed second data record 410.

Figure 5:
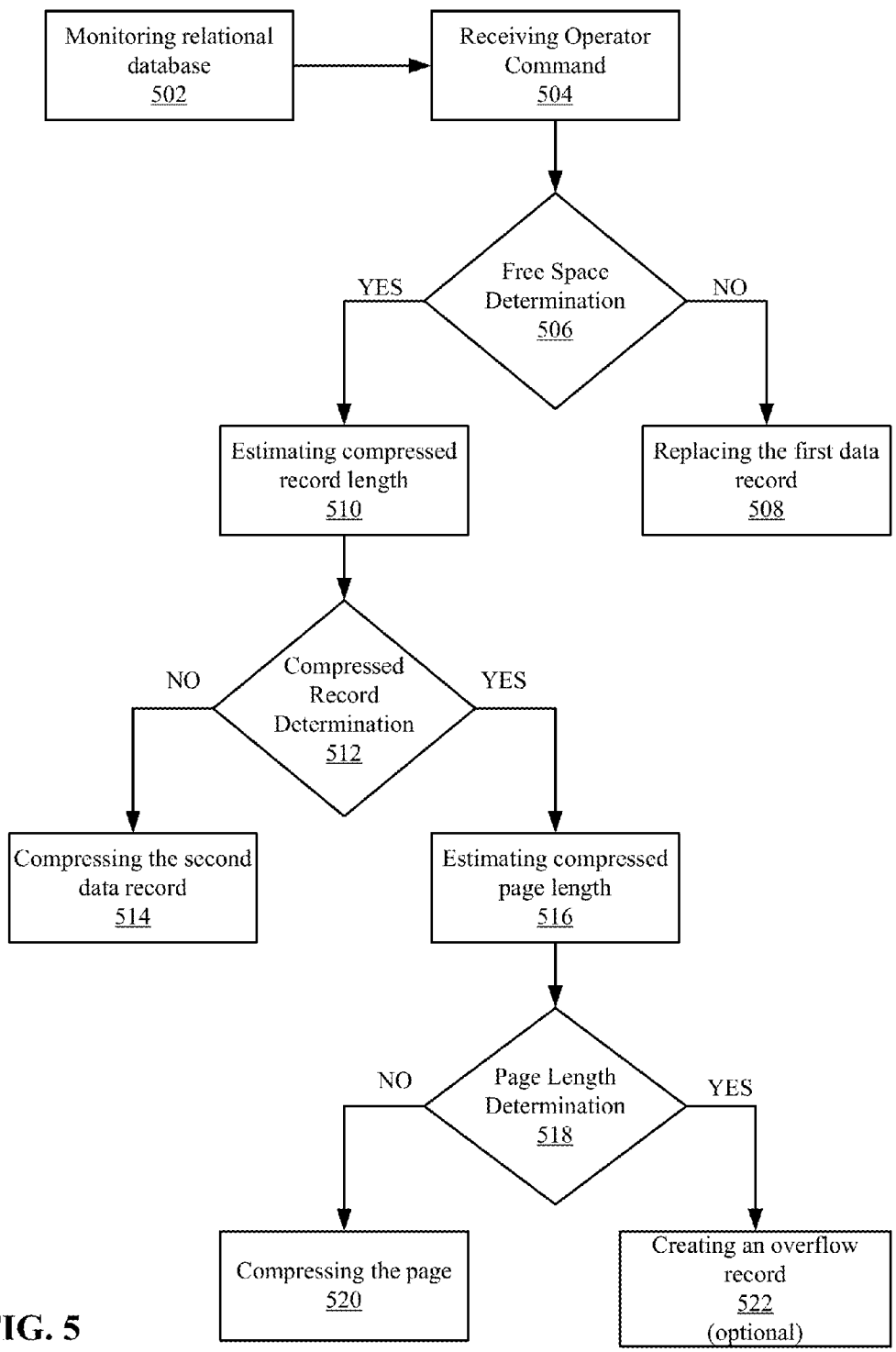
FIG. 5 depicts one embodiment of an example process for managing data records in a relational database.

FIG. 5 depicts one embodiment of an example process for managing data records in a relational database, according to embodiments. At block 502, the relational database is monitored by a database management system (DBMS). In embodiments, the database management system may support an arbitrary number of databases, although for the sake of example, only one database is considered for this discussion. In various embodiments, the DBMS may allow users to perform basic database operations, such as: defining a database, altering the definition of the database, creating, editing and removing records in the database, viewing records in the database, defining database indexes, and so forth. Monitoring the relational database at block 502 may include tracking the record lengths of data records stored within the database as well as tracking the amount of free space remaining within pages stored within the database.

At block 504, the DBMS receives an operator command. The operator command may be an SQL operator command, such as the modifier commands insert, merge, delete, and update or utility statements load, shrlevel, and change. For the sake of example, the following discussion assumes that the SQL operator command is an UPDATE SQL operator command, however various operator commands are envisioned and the example is not intended to be limiting. In embodiments, the operator command may indicate that a first data record needs to be replaced with a second data record.

In response to receiving an UPDATE SQL operator command, the DBMS makes a free space determination at block 506. In embodiments, a free space determination may include measuring the record length of the second data record and comparing the record length of the second data record with the amount of free space remaining in the page where the second data record may be stored. In various embodiments, the amount of free space remaining in the page may include the amount of space saved by replacing a first data record with a second data record. In certain embodiments, the second data record may include the first data record. If the DBMS determines that the record length of the second data record does not go outside of the amount of free space remaining in the page, the DBMS replaces the first data record with the second data record at block 508. In response to replacing the first data record with the second data record, the DBMS may continuing monitoring the relational database as described at block 502.

If the DBMS determines that the record length of the second data record does go outside of the amount of free space remaining in the page, the DBMS estimates the record length of a compressed second data record at block 510, in this example. Aspects of the present disclosure may be similar or the same as aspects described in FIG. 1 with respect to the estimating module 108. Estimating the record length of a compressed second data record may include generating statistics with and without performing compression as well as the percentage of space the database expects to save. In embodiments, estimating the record length may include statistics such as the number of rows scanned to build a dictionary to perform compression, the number of rows processed to deliver the statistics, the average row lengths before and after compression, the size of the dictionary in pages before and after compression, the size of the table space in pages before and after compression, and percentages of pages that may be saved.

Utilizing the statistics calculated at block 510, the DBMS makes a compressed record determination at block 512, in this example. In various embodiments, a compressed record determination may include comparing the record length of the estimated compressed second data record with the amount of free space remaining in the page where the second data record may be stored. If the DBMS determines that the record length of the estimated compressed second data record does not go outside of the amount of free space remaining in the page, the second data record may be compressed at block 514 utilizing compression techniques discussed herein (e.g., FIG. 1 with respect to the compression module 110). In embodiments, in response to compressing the second data record, the DBMS replaces the first data record with the compressed second data record. In further embodiments, in response to replacing the first data record with the compressed second data record, the DBMS may continue to monitor the database as described at block 502. If the DBMS determines that the record length of the estimated compressed second data record does go outside of the amount of free space remaining in the page, the DBMS estimates the page length of a compressed page where the second data record is stored at block 516.

Estimating the page length of a compressed page may utilize similar or the same techniques used in estimating compressed record lengths at block 510. In response to determining statistics pertaining to a compressed page at block 510, the DBMS makes a page length determination at block 518. In embodiments, a page length determination may include comparing the page length of an estimated compressed page with the page length of the original page. If the DBMS determines that the page length of an estimated compressed page does not go outside of the page length of a page (e.g., the original page), the DBMS compresses the page at block 520 utilizing the same or similar compression techniques used at block 514 as discussed herein (e.g., FIG. 1 with respect to the compression module 110). In embodiments, in response to compressing the page, including the second data record, the DBMS may continue to monitor the relational database as discussed at block 502.

If the DBMS determines that the page length of an estimated compressed page does go outside of the page length, the DBMS may optionally create an overflow record for the second data record at block 522. Various embodiments of the process depicted in FIG. 5 are envisioned. Individual operations at individual blocks discussed separately may be performed simultaneously or temporarily. For example, the DBMS may be able to estimate the record length of a compressed second data record and estimate the page length of a compressed page, including the second data record, simultaneously. In another example, the DBMS may, instead of estimating, temporarily compress the second data record or temporarily compress the page containing the second data record and immediately after compressing attempt to replace the first data record with the compressed second data record or replace the page with the compressed page.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer implemented method for managing data records in a relational database, the method comprising:
    monitoring, by a processor, a record length for a first data record of the relational database stored in a page of memory, an amount of free space in the page, and a page length of the page;
    receiving an operator command to replace the first data record with a second data record in the relational database;
    determining, based upon receiving the operator command, whether an estimated record length of an compressed second data record is outside of the amount of free space in the page;
    in response to determining that the estimated record length of the compressed second data record is outside of the amount of free space in the page, determining whether an estimated length of a compressed page that includes the second data record is outside of the page length; and
    in response to determining that the estimated length of the compressed page is within the page length, compressing the page including the second data record in the relational database.

2. The method of claim 1, wherein receiving the operator command includes comparing the record length of the second data record with the amount of free space in the page.

3. The method of claim 2, further comprising:
    determining, based on comparing the record length of the second data record with the amount of free space in the page, the record length of the second data record to be within the amount of free space in the page; and
    replacing the first data record with the second data record.

4. The method of claim 1, wherein determining whether an estimated record length of a compressed second data record is outside of the amount of free space in the page further comprises:
    comparing the record length of the second data record with the amount of free space in the page;
    estimating, in response to comparing, a record length of a compressed second data record; and
    comparing, in response to estimating, the estimated record length of the compressed second data record with the amount of free space in the page.

5. The method of claim 4, further comprising:
    determining, based upon the comparing, the estimated record length of the compressed second data record is within the amount of free space in the page;
    compressing the second data record; and
    replacing the first data record with the compressed second data record.

6. The method of claim 1, wherein determining whether the estimated length of a compressed page that includes the second data record is outside of the page length further comprises:
- estimating a length of a compressed page; and
- comparing, in response to estimating, the estimated length of the compressed page with the page length.

7. The method of claim 6, wherein in response to determining that the estimated length of the compressed page is within the page length, the method further comprises:
- compressing the page; and
- replacing the page with a compressed page.

8. The method of claim 6, wherein comparing the estimated length of the compressed page with the page length further comprises:
- determining the estimated length of the compressed page is outside of the page length; and
- creating an overflow record for the second data record.

9. The method of claim 1, wherein the operator command corresponds with modifier commands, the modifier commands including update operators.

10. The method of claim 1, wherein the amount of free space in the page includes reserved or unused space in the page in the relational database.

11. A computer program product for managing data records in a relational database, the computer program product comprising a computer readable storage medium having program instructions embodied therewith, wherein the computer readable storage medium is not a transitory signal per se, the program instructions executable by a processor to cause the processor to perform a method comprising:
- monitoring, by the processor, a record length for a first variable data record of the relational database stored in a page of memory, an amount of free space in the page, and a page length of the page;
- receiving an operator command to replace the first variable data record with a second variable data record in the relational database;
- determining, by the processor, based upon receiving the operator command, whether an estimated record length of a compressed variable second data record is outside of the amount of free space in the page;
- in response to determining that the estimated record length of the compressed variable second data record is outside of the amount of free space in the page, determining whether an estimated length of a compressed page that includes the variable second data record is outside of the page length; and
- in response to determining that the estimated length of the compressed page is within the page length, compressing the page including the second data record in the relational database.

12. The computer program product of claim 11, wherein determining whether the estimated length of a compressed page that includes the variable second data record is outside of the page length further comprises:
- estimating a length of a compressed page; and
- comparing, in response to estimating, the estimated length of the compressed page with the page length.

13. The computer program product of claim 12, wherein in response to determining that the estimated length of the compressed page is within the page length, the method further comprises:
- compressing the page; and
- replacing the page with a compressed page.

14. The computer program product of claim 12, wherein comparing the estimated length of the compressed page with the page length further comprises:
- determining the estimated length of the compressed page is outside of the page length; and
- creating an overflow record for the second variable data record.

15. The computer program product of claim 11, wherein the operator command corresponds with modifier commands, the modifier commands including update operators.

16. A computer system for managing data records in a relational database, the computer system comprising:
- a memory; and
- a processor in communication with the memory, wherein the processor is configured to perform a method, the method comprising:
  - monitoring, by the processor, a record length for a first data record of the relational database stored in a page of memory, an amount of free space in the page, and a page length of the page;
  - receiving an operator command to replace the first data record with a second data record in the relational database;
  - determining, by the processor, based upon receiving the operator command, whether an estimated record length of a compressed second data record is outside of the amount of free space in the page;
  - in response to determining that the estimated record length of the compressed second data record is outside of the amount of free space in the page, determining whether an estimated length of a compressed page that includes the second data record is outside of the page length; and
  - in response to determining that the estimated length of the compressed page is within the page length, compressing the page including the second data record in the relational database.

17. The computer system of claim 16, wherein receiving the operator command includes comparing the record length of the second data record with the amount of free space in the page.

18. The computer system of claim 17, further comprising:
- determining, based on comparing the record length of the second data record with the amount of free space in the page, the record length of the second data record to be within the amount of free space in the page; and
- replacing the first data record with the second data record.

19. The computer system of claim 16, wherein determining whether an estimated record length of a compressed second data record is outside of the amount of free space in the page further comprises:
- comparing the record length of the second data record with the amount of free space in the page;
- estimating, in response to comparing, a record length of a compressed second data record; and
- comparing, in response to estimating, the estimated record length of the compressed second data record with the amount of free space in the page.

20. The computer system of claim 19, further comprising:
- determining, based upon the comparing, the estimated record length of the compressed second data record is within the amount of free space in the page;
- compressing the second data record; and
- replacing the first data record with the compressed second data record.

* * * * *